United States Patent
Kobayashi

(10) Patent No.: US 7,293,211 B2
(45) Date of Patent: Nov. 6, 2007

(54) SEMICONDUCTOR INTEGRATED CIRCUIT

(75) Inventor: Yoshiki Kobayashi, Kanagawa (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 109 days.

(21) Appl. No.: 11/206,948

(22) Filed: Aug. 19, 2005

(65) Prior Publication Data

US 2006/0048029 A1    Mar. 2, 2006

(30) Foreign Application Priority Data

Aug. 24, 2004   (JP) ............................. 2004-243453

(51) Int. Cl.
*G01R 31/28* (2006.01)
(52) U.S. Cl. .................. 714/729; 714/726; 714/727
(58) Field of Classification Search ................ 714/729, 714/726

See application file for complete search history.

(56) References Cited

U.S. PATENT DOCUMENTS

2003/0226083 A1* 12/2003 Yamanaka et al. .......... 714/744
2004/0181723 A1* 9/2004 Nakao et al. ................ 714/726
2004/0250185 A1* 12/2004 Date ........................... 714/726

FOREIGN PATENT DOCUMENTS

| JP | 5-142298 | 6/1993 |
|---|---|---|
| JP | 2002-009238 | 1/2002 |

\* cited by examiner

*Primary Examiner*—Cynthia Britt
*Assistant Examiner*—Saqib J. Siddiqui
(74) *Attorney, Agent, or Firm*—Nixon Peabody LLP; Donald R. Studebaker

(57) ABSTRACT

The number of S-FFs in a scan-path is decreased by half and a test time needed is decreased. An I/O terminal 1A is connected to a scan-path $3_1$-$3_m$ and a combination circuit 2 via a selector 5A and an output of the scan-path $3_1$-$3_m$ is connected to an I/O terminal 1B via a selector 6A and a tri-state buffer 7A. The I/O terminal 1B is connected to a scan-path $3_{m+1}$-$3_n$ and to the combination circuit 2 via a selector 5B and the output of the scan-path $3_{m+1}$-$3_n$ is connected to the I/O terminal 1A via a selector 6B and tri-state buffer 7B. When testing, the tri-state buffers are turned off and test-data are supplied by connecting the I/O terminal 1A, 1B to the scan-path $3_1$-$3_m$, $3_{m+1}$-$3_n$ respectively. Thereafter, output signals of the combination circuit is applied to each S-FF 3, and the test data are read out from the I/O terminal 1A, 1B by turning on the each tri-state buffer 7A, 7B.

2 Claims, 3 Drawing Sheets

SEMICONDUCTOR INTEGRATED CIRCUIT

BACKGROUND OF THE INVENTION

1. Field of the Invention

The present invention relates generally to a semiconductor integrated circuit with scan-path.

2. Description of the Related Art

Recently, semiconductor circuit's structure has become large and complex. To accomplish easy function test of these semiconductor circuits, DFT(Design-for-Testability) with scan-path has been adopted. The scan-path is a shift register chain configured by a plurality of flip-flops (FFs) inserted in logic circuit, operating synchronously with clock signal, whereby the FFs are switched to configure shift register by switching circuit on test-mode operation. The function test of a combination circuit can be done easily by applying test dada at any point in the combination circuit by utilizing the scan-path or reading out a signal on any point of the combination circuit thorough the scan-path.

FIG. 1 shows a structure of a semiconductor integrated circuit with scan-path of related art. This semiconductor integrated circuit complies an input/output (I/O) terminal 1A, 1B, and combination circuit 2 executing predetermined logical operation. A plurality of FFs with scan function (S-FF) $3_1, 3_2, \ldots, 3_n$ are inserted at various positions of the combination circuit 2. Each S-FF $3_1, \ldots, 3_n$ has a similar construction such as shown by S-FF $3_1$ and complies a selector 3a and a FF 3b.

The selector 3a selects a signal of terminal A when a test mode is set by a mode signal MOD, and selects signal of terminal B when a normal operation mode is set by the MOD. The FF 3b retains and outputs a selected signal by the selector 3a according to the clock signal (not shown). An output signal from combination circuit 2 is fed to the terminal B of the selector 3a and the output signal (synchronized with clock signal) of FF 3b is fed to the combination circuit 2. The output signal of FF 3b is also fed to the terminal A of selector 3a of subsequent S-FF $3_2$ via signal path $4_1$.

Meanwhile, the I/O terminal 1A is connected to a terminal I of the combination circuit 2 and to the terminal A of the selector 3a of the S-FF $3_1$ via selector 5. The selector 5 feeds the signal of the I/O terminal to the S-FF $3_1$ when the test mode is set by the MOD and feeds the signal to the combination circuit 2 when normal operation mode is set by the MOD.

An output signal of the last stage S-FF $3_n$ and an output signal of an output terminal O of the combination circuit are fed to the output terminal 1B via a selector 6. The selector 6 selects an output signal from S-FF $3_n$ of terminal A when test mode is set by the MOD and selects an output signal from the combination circuit 2 of terminal B when normal operation mode is set by the MOD.

The operation of above mentioned semiconductor integrated circuit of the prior art will be described below.

Firstly, when the test mode is set by the mode signal MOD, the selector 3a of each S-FF $3_1$-$3_n$ and the selector 5,6 are all switched to terminal A. Thus, a scan-path from the I/O terminal 1A to the I/O terminal 1B via selector 5,S-FF $3_1$-$3_n$ is formed.

The n test-data are then sequentially applied to the I/O terminal 1A synchronously with the clock signal. A plurality of inputted test-data are herewith stored by each FF 3b in S-FF $3_1$-$3_n$. As the plurality of test-data stored by each of the FF 3b are also fed to the combination circuit 2, a signal corresponding to the given test-data is outputted from the combination circuit 2. The signal from the combination circuit 2 is supplied to each terminal B of each selector 3a of S-FF $3_1$-$3_n$.

In this state of things, the semiconductor integrated circuit is set to normal operation state by the mode signal MOD, and is given only one pulse clock signal. The signals being outputted from combination circuit according to the test-data are herewith retained in each FF 3b of S-FF $3_1$-$3_n$.

The mode signal MOD is switched back to the test-mode and clock signal is fed to the semiconductor integrated circuit. The signals retained in each FF 3b are outputted sequentially from I/O terminal 1B. A determination whether the signal from terminal 1B is corresponding to the test-data is made and the functions of the combination circuit 2 is tested.

In this semiconductor integrated circuit, when normal operation mode is set by the mode signal MOD, the selectors 3a in each S-FF $3_1$-$3_n$ and the selector 5,6 are all switched to terminal B. A plurality of paths 4 connected sequentially between neighboring S-FF 3 are shut down and each S-FF 3 operates as timing adjusting FF, which retains the signal from the combination circuit 2 and outputs it synchronously with clock signals.

A test circuit that can change a length of scan-path by selecting a plurality of paths to be tested freely among a plurality of combination circuits grouped by scan-path is disclosed in Japanese Laid-open Publication No. 5-142298, and another example is disclosed in Japanese Laid-open Publication No. 2002-9238. A design method of scan-path is disclosed in latter literature, that is, in a semiconductor integrated circuit with a plurality of combination circuits with scan-path, each scan-path length is equalized for reducing test execution time.

In a conventional scan-path circuit, a pair of I/O terminal 1A,1B are needed for one scan-path. On the other hand, according to the large scaling and complexity of semiconductor integrated circuit, the number of S-FFs 3 connected to the combination circuit 2 is increasing dramatically. But to increase the number of I/O terminals is difficult depending on the number of S-FFs. Therefore the number of scan-FFs that consists of one scan-path increases, so a test time needed is increasing.

SUMMARY OF THE INVENTION

The invention aims to solve above mentioned drawbacks and reduces test-time by decreasing the number of S-FFs by half by configuring a scan-path by assigning two scan-paths with a pair of I/O terminal.

The semiconductor integrated circuit of this invention comprises a first and second I/O terminal; a first and second scan-path comprising a plurality of S-FFs connected in cascading manner for testing combination circuits; the first I/O terminal is connected to the combination circuit in normal operation mode; the first I/O terminal is connected to the input of the first scan-path when providing test-data to the combination circuits; a first switching means that connects the first I/O terminal to the output of the second scan-path when reading out test-data from the combination circuit; a second switching circuit that connects the second I/O terminal to the combination circuit in normal operation mode, wherein the switching circuit connects the second I/O terminal to the input of the second scan-path when test-data is supplied to the combination circuit and it connects the second I/O terminal to the output of the first scan-path when a test-data are read out from combination circuit.

In this invention, two scan-paths are configured when test-data is supplied to the combination circuit. The one is the path from the first I/O terminal to the first scan-path, the other one is the path from the second I/O terminal to the second scan-path. Similarly, two scan paths are configured when test-data are read out from the combination circuit. The one is the path from the first scan-path to the second I/O terminal, the other is the path from the second scan-path to the first I/O terminal. Therefore, the number of S-FFs consisting a scan-path is decreased by half, and the testing time needed is decreased.

In this invention two scan-paths are assigned to each available pair of I/O terminal for testing and S-FF are disposed in a manner that the number of S-FFs of each scan-path is nearly the same. Each scan-paths are supplied test-data at the same time by common clock signal and a plurality of test-data from the combination circuit are read out simultaneously by the common clock signal.

The above mentioned objects, aspect and advantages of the present invention will become apparent to those skilled in the art from the following preferred embodiment in conjunction with the accompanying drawings. It should be noted that the drawings are merely for description and do not limit the scope of the present invention.

DETAILED DESCRIPTION OF THE INVENTION FIRST PREFERRED EMBODIMENT

Figure 1:
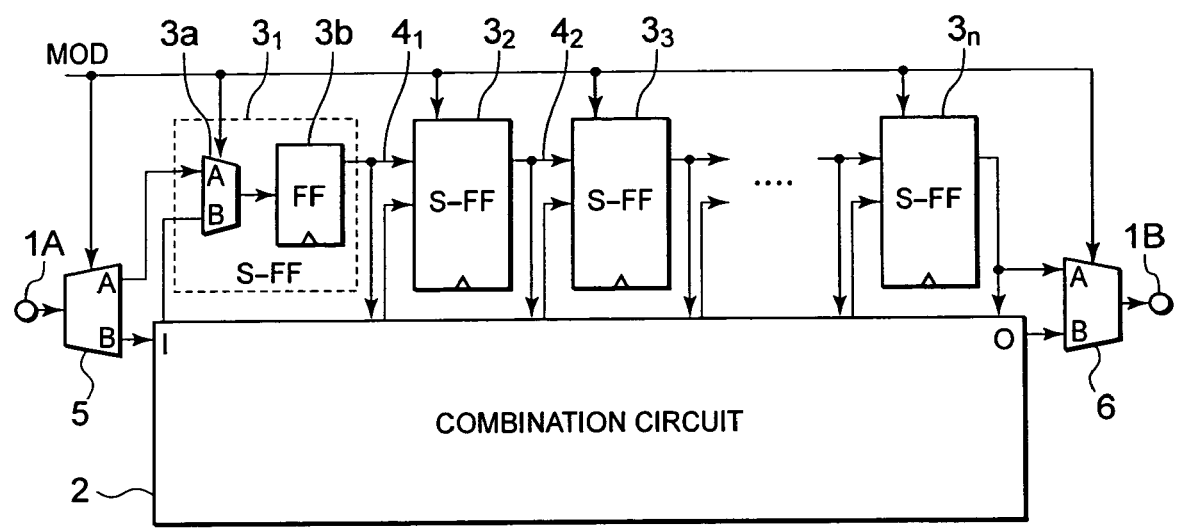
FIG. 1 is a block diagram illustrating the configuration of a semiconductor integrated circuit of related art.
Figure 2:
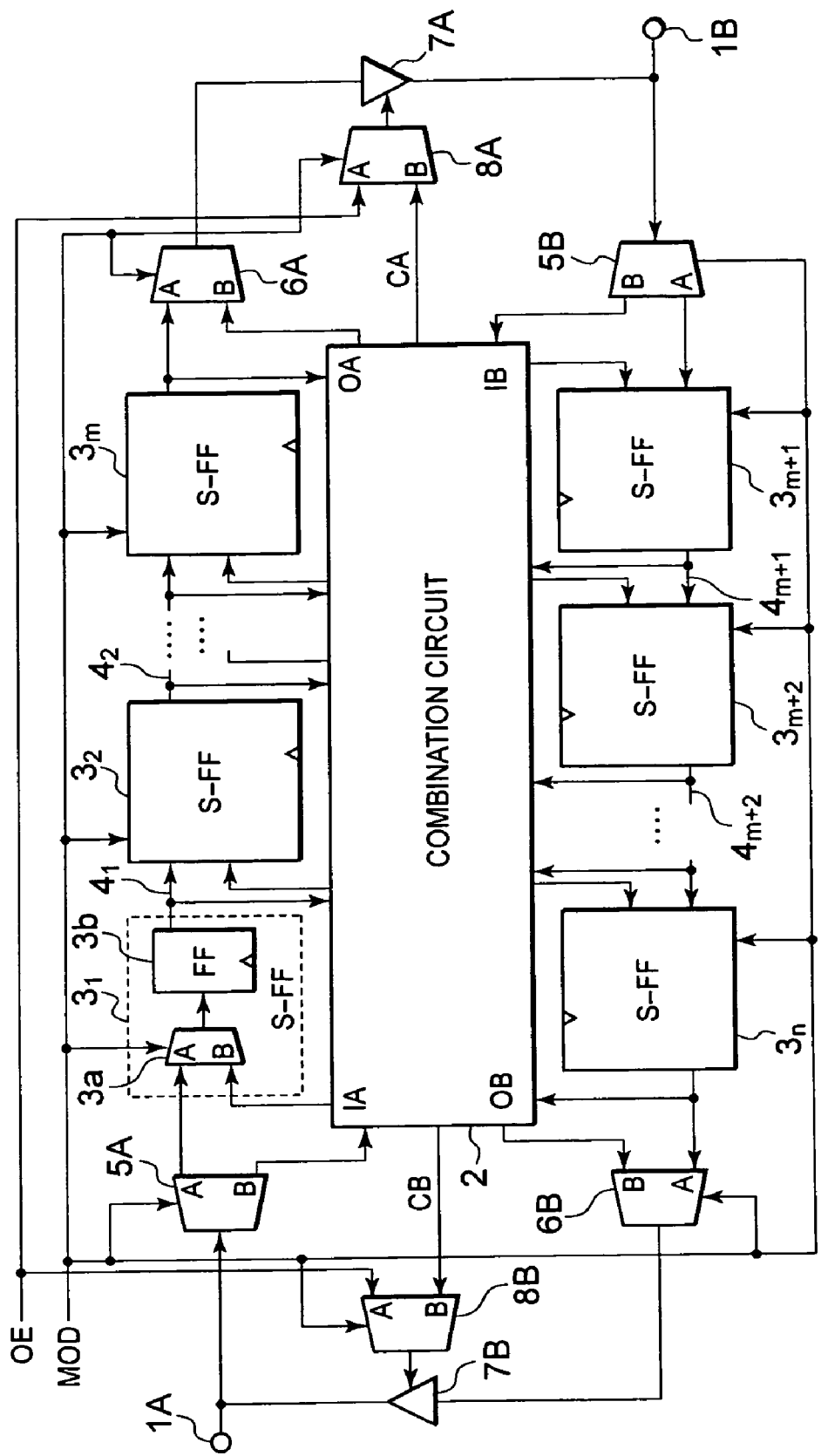
FIG. 2 is a block diagram illustrating the configuration of a semiconductor integrated circuit according to the first embodiment of the present invention.

FIG. 2 is a block diagram illustrating the configuration of a semiconductor integrated circuit according to the first preferred embodiment of the present invention. In FIG. 2 a similar components as in FIG. 3 are assigned a same number.

Figure 3:
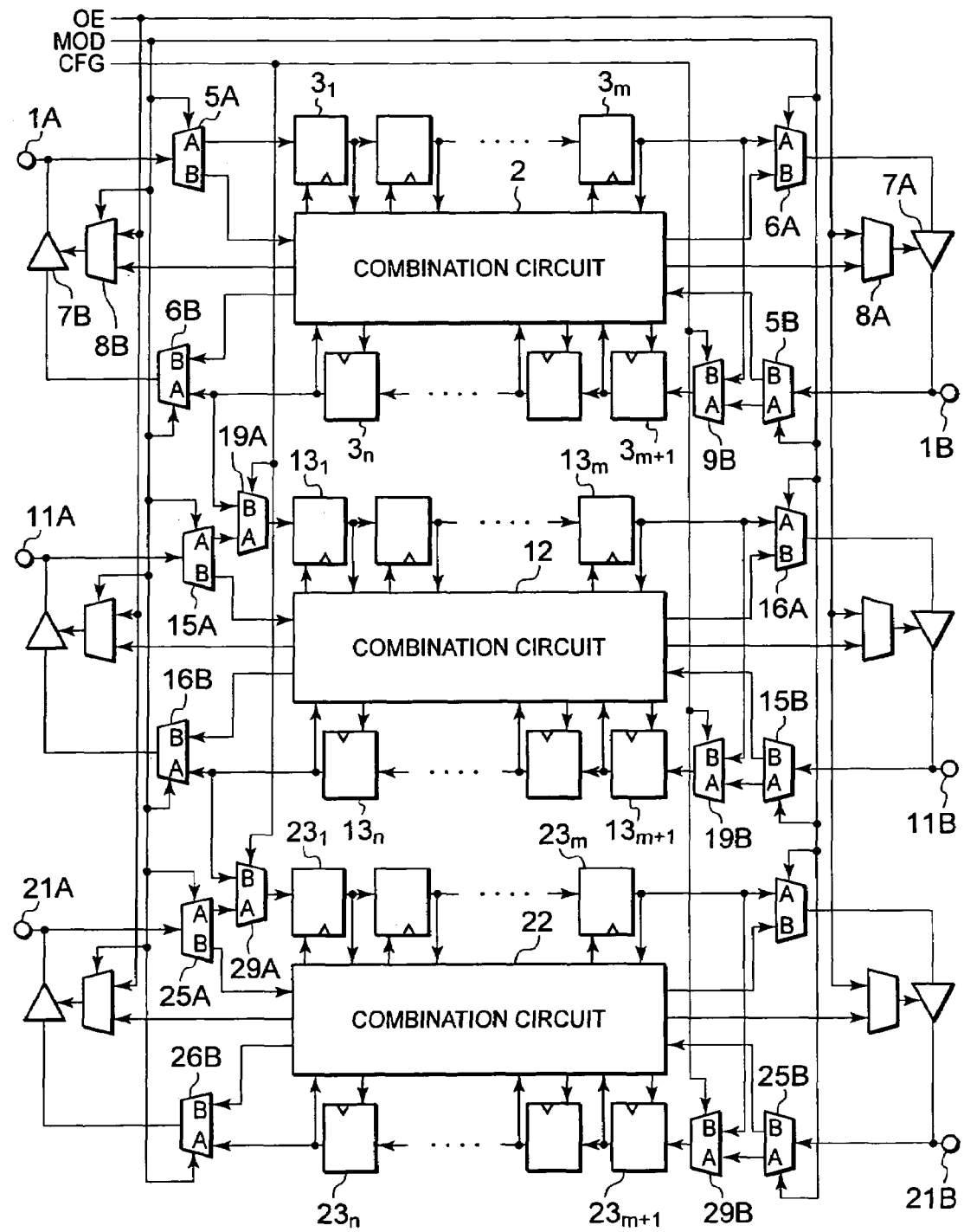
FIG. 3 is a block diagram illustrating the configuration of a semiconductor integrated circuit according to the second embodiment of the present invention.

The integrated circuit of FIG. 2 includes, as similar to FIG. 3, I/O terminals 1A, 1B, and a combination circuit 2, wherein a plurality of S-FFs $3_1, 3_2, 3_m, 3_{m+1}, 3_{m+2}, \ldots, 3_n$ are inserted in many positions of the combination circuit 2. These S-FFs $3_1, \ldots, 3_m$ are mutually connected in a cascading manner via path $4_1, 4_2, \ldots$ and S-FFs $3_{m+1}, \ldots 3_n$ are mutually connected in a cascading manner via path $4_{m+1}, 4_{m+2}, \ldots$ and each path constructs a first and a second scan-path respectively.

Each S-FF 31, . . . ,3n is in a similar construction, for example, as shown in S-FF $3_1$, the S-FF includes a selector 3a and FF 3b. The selector 3a selects a signal on terminal A when a test-mode is set by mode signal MOD and selects a signal on terminal B when a normal operation mode is set. FF 3b retains and outputs a signal selected by selector 3a in response to the clock signal (not shown). The terminal B of the selector 3a is supplied a signal from the combination circuit 2 and a signal outputted from FF 3b is timing controlled by the clock signal is fed to the combination circuit 2. The output signal from FF 3b is also fed to the terminal A of selector 3a in subsequent stage S-FF $3_2$ via path $4_1$.

The I/O terminal 1A is connected, via selector 5A, to the terminal IA of the combination circuit 2 and the terminal A of the selector 3a. The selector 5A outputs the signal of I/O terminal 1A to the S-FF $3_1$ when test-mode is set by the mode signal MOD and outputs the same signal to the combination circuit 2 when normal operation mode is selected.

The output signal of the S-FF $3_m$ and the output signal of the terminal OA of the combination circuit 2 are supplied to a tri-state buffer circuit 7A via a selector 6A. The selector 6A selects a signal of terminal A from S-FF 3m, when test mode is set by mode signal MOD and selects a signal of terminal B from the combination circuit 2 when normal operation mode is set.

The tri-state buffer circuit 7A is controlled in "ON" state or "OFF" state by a control signal from selector 8A and the output of it is connected to the I/O terminal 1B. The selector 8A selects an output control signal OE from external source when test mode is set by the mode signal MOD and selects a switching signal from the combination circuit 2 when normal operation mode is set.

The I/O terminal 1B is connected to a terminal IB of the combination circuit 2 and to the S-FF $3_{m+1}$ via a selector 5B. The selector 5B provides a signal from the I/O terminal 1B to the S-FF $3_{m+1}$ when test-mode is set by the mode signal MOD and provides the same signal to the combination circuit 2 when normal operation mode is set.

The output signal of the S-FF $3_n$ and the output signal from a terminal OB of the combination circuit 2 are fed to tri-state buffer circuit 7B via selector 6B. The selector 6B, in a similar manner of the selector 6A, selects a signal of a terminal A when test-mode is set by the mode signal MOD and selects a signal of terminal B when a normal operation mode is set.

The tri-state buffer circuit 7B is controlled between "ON" state and "OFF" state by a control signal from a selector 8B and the output signal of it is fed to the I/O terminal 1A. The selector 8B selects the output control signal OE from external source when test-mode is set by mode signal MOD and selects switching signal CB from the combination circuit 2 when normal operation mode is set.

These selectors 5A, 6B, 8B and tri-state buffer circuit 7B constitute a first switching means to force I/O terminal 1A to connect to the combination circuit 2 in normal operation mode, and to connect the I/O terminal 1A to an input stage of a first scan-path when the test-data is fed to the combination circuit 2, and to connect the I/O terminal 1A to an output stage of a second scan-path when test data is read out from the combination circuit 2.

Similarly, selectors 5B, 6A, 8A and tri-state buffer circuit 7A constitute a second switching means to force I/O terminal 1B to connect to the combination circuit 2 in normal operation mode, and to connect the I/O terminal 1B to an input stage of the second scan-path when the test-data is fed to the combination circuit 2, and to connect the I/O terminal 1B to an output stage of the first scan-path when test data is read out from the combination circuit 2.

The operation of semiconductor integrated circuit of FIG. 2 in the test-mode will be described below. Firstly, test-mode is set by the mode signal MOD, and the output control signal OE is set to inhibit output. Because the test-mode is set, the selector 3b in each S-FF $3_1$-$3_n$ and selector 5A, 5B, 6A, 6B, 8A, 8B are all switched to the terminal A. Therefore the tri-state buffer 7A, 7B are both set to "OFF" state and two scan-path is formed; one is from the I/O terminal 1A to the selector 6A through selector 5A and S-FF $3_1$-$3_m$ configuring shift register (this scan-path is referred to the first scan-path), the other is from I/O terminal 1B to the selector 6B through selector 5B and S-FF $3_{m+1}$-$3_n$ configuring shift register (this scan path is referred to the second scan-path).

The m and n-m test-data are fed serially from each I/O terminal 1A, 1B synchronously with clock signal. The test-data are stored in each FF 3b in S-FF $3_1$-$3_n$. These test-data stored in each FF 3b is also fed to the combination circuit 2 and the response signal to this test-data is outputted from the combination circuit 2. This output signal is fed to the terminal B of each selector 3a in S-FF $3_1$-$3_n$.

In this state of things, normal operation mode is set by the mode signal MOD and a pulse of clock signal is given once, then the output signal from the combination circuit 2 in response to the given test-data is stored by each FF 3b in S-FF $3_1$-$3_n$.

Thereafter, the mode signal MOD is set back to the test-mode and the output enable signal OE is set to output enabling state. This results in "ON" state of tri-state buffers 7A, 7B, and two scan-path is formed; one is from the S-FF $3_1$-$3_m$ to the I/O terminal 1B through the selector 6A and tri-state buffer 7a, the other is from the S-FF $3_{m+1}$-$3_n$ to the I/O terminal 1A through the selector 6B and the tri-state buffer 7B.

When clock signal is supplied in this state of things, the signal from the combination circuit 2 stored in each FF 3b is outputted from I/O terminal 1A, 1B serially in synchronous with the clock signal. Therefore the function test of the combination circuit 2 will be possible based on the determination whether the outputted signal is matched with the predetermined test data.

In this semiconductor integrated circuit, when normal operation mode is set by mode signal MOD, the selector 3b in each S-FF $3_1$-$3_n$ and the selector 5A, 5B, 6A, 6B are all switched to the terminal of B. Therefore the path 4 connected between adjacent S-FF 3 is in shut off state and each S-FF 3, retaining and outputting signals from the combination circuit 2 synchronous with clock signal, operates as timing adjusting FF. Because the selector 8A, 8B are also switched to the terminal of B, the tri-state buffers 7A,7B are controlled between "ON" state and "OFF" state based on the switching signal CA, CB from combination circuit 2, and the I/O terminal 1A, 1B are switched to either input terminal or output terminal.

In this manner, the semiconductor integrated circuit of this embodiment assigns two scan-paths to a pair of I/O terminal 1A, 1B and set to operate both I/O terminal 1A, 1B as input terminal so as to input test data in two scan-path simultaneously. When test-data are read out, these I/O terminal 1A, 1B are operated as outputting terminal so as to output test data, from the two scan-path, are outputted simultaneously. Therefore, an advantage exists that the number of S-FFs included in a scan-path is decreased by half and the test time needed is decreased.

It should be noted that the invention described above is not limited to the above mentioned embodiment, but various variation may be possible, for example, (a) the I/O terminal 1A, 1B are not restricted to one pair; a similar scan-path could be formed in each usable pair of I/O terminal; an efficient test operation will be possible by depositing S-FF consisting each scan-path evenly. (b) The connection state between I/O terminal 1A, 1B and the combination circuit 2 is not restricted to the circuit in the drawings, but a circuit construction according to an application of I/O terminals 1A, 1B will be employed.

SECOND PREFERRED EMBODIMENT

FIG. 3 is a block diagram illustrating the configuration of a semiconductor integrated circuit according to the second embodiment of the present invention. This circuit includes three pairs of similar circuits as of FIG. 2. In these circuits, similar component of FIG. 2 in upper stand circuit are assigned same reference number. In order to distinguish these three pairs of circuits, the components in middle circuit is assigned reference number of range of 10-19, and the components of lower stand circuit are assigned reference number above 20.

In the upper stand circuit, a selector 9B as configuration changing means is added between selector 5B and S-FF $3_{m+1}$. The selector 9B selects a signal of terminal A when assigned parallel chain by an external switching signal CFG and selects a signal of terminal B and outputs it when assigned serial chain by the switching signal CFG. The terminal A of selector 9B is connected to a terminal A of selector 5B and terminal B of selector 9B is connected to an output terminal of S-FF $3_m$.

In the middle stand circuit, a selector 19A is added between selector 15A and S-FF $13_1$ and selector 19B is added between selector 15B and S-FF $13_{m+1}$. The selector 19A, similar to selector 9B, selects a signal of terminal A when assigned parallel chain by the switching signal CFG and selects a signal of terminal B and output it when assigned serial chain by the switching signal CFG. The terminal A of the selector 19A is connected to a terminal A of selector 15A and terminal B of selector B is connected to an output signal of S-FF $3_n$ of upper stand circuit. The selector 19B executes similar operation as that of selector 9B of upper stand circuit.

In the lower stand circuit, a selector 29A is added between selector 25A and S-FF $23_1$ and a selector 29B is added between selector 25B and S-FF$23_{m+1}$. These selector 29A, 29B execute similar operation as that of the selector 19A, 19B in the middle stand circuit.

In the semiconductor integrated circuit of this embodiment, selectors 9B, 19A, 19B, 29A, 29B are all switched to the terminal B when parallel chain is assigned by the switching signal CFG. So the constructions of each upper, middle, lower stand circuit are similar to that of FIG. 2, and similar operation to that in the circuit of FIG. 2 is executed respectively in parallel.

On the other hand, selectors 9B, 19A, 19B, 29A, 29B are all switched to the terminal B when serial chain is assigned by the switching signal CFG. So, the scan-path of S-FF$3_1$-$3_m$ and the scan-path of S-FF $3_{m+1}$-$3_n$ are connected in serial by the selector 9B. The scan-path of S-FF $3_{m+1}$-$3_n$ and scan-path of FF$13_1$-$13_m$ is also serially connected by the selector 19A. Similarly, a scan-path of S-FF $13_1$-$13_m$ and scan-path of $13_{m+1}$-$13_n$ are connected in serial by the selector 19B, a scan-path of S-FF$13_{m+1}$-$13_n$ and scan-path of S-FF $23_1$-$23_m$ are serially connected by the selector 29A, a scan-path of S-FF $23_1$-$23_m$ and a scan-path of S-FF $23_{m+1}$-$23_n$ are serially connected by the selector 29B respectively. As a result, a scan-path of serially connected S-FF is formed.

As mentioned above, the semiconductor integrated circuit of the second embodiment includes a serially connection means (the selector 9B, 19A, etc.) that connects a plurality of scan-path serially. Therefore, an advantage similar to that of the circuit of the first embodiment is accomplished by assigning a parallel chain by the switching signal CFG. A test can be done by a single and long scan-path that is formed by assigning a serial chain, so an advantage of forming a suitable scan-path is obtained.

What is claimed is:

1. A semiconductor integrated circuit comprising:

a first and a second input/output (I/O) terminal;

a first scan-path comprising a plurality of flip-flops with scan function connected in a cascading manner for testing a combination circuit;

a second scan-path which is independent from the first scan-path comprising a plurality of flip-flops with scan function connected in a cascading manner for testing a combination circuit;

a first switching circuit connecting the first I/O terminal to the combination circuit when a normal operation mode is set, for connecting the first I/O terminal to an input of the first scan-path when test-data is applied to the combination circuit, for connecting the first I/O terminal to an output of the second scan-path when reading out test data from the combination circuit; and a second switching circuit connecting the second I/O terminal to the combination circuit when the normal operation mode is set, for connecting the second I/O terminal to the input of the second scan-path when test-data is applied to the combination circuit, for connecting the second I/O terminal to the output of the first scan-path when reading out test data from the combination circuit.

2. The semiconductor integrated circuit according to claim 1 further comprising:

a configuration changing means for connecting the output of the first scan-path to the input of the second scan-path when assigned a serial chain by a switching signal, for connecting the I/O terminal to the input of the second scan-path when assigned parallel chain by the switching signal.

* * * * *